(12) United States Patent
Shido

(10) Patent No.: US 10,777,234 B2
(45) Date of Patent: Sep. 15, 2020

(54) OFF-CHIP DRIVER

(71) Applicant: Winbond Electronics Corp., Taichung (TW)

(72) Inventor: Taihei Shido, Kanagawa (JP)

(73) Assignee: Winbond Electronics Corp., Taichung (TW)

(*) Notice: Subject to any disclaimer, the term of this patent is extended or adjusted under 35 U.S.C. 154(b) by 0 days.

(21) Appl. No.: 16/115,579

(22) Filed: Aug. 29, 2018

(65) Prior Publication Data

US 2020/0075060 A1 Mar. 5, 2020

(51) Int. Cl.
*G11C 5/14* (2006.01)
*H03K 19/003* (2006.01)

(52) U.S. Cl.
CPC ......... *G11C 5/14* (2013.01); *H03K 19/00384* (2013.01)

(58) Field of Classification Search
CPC ............................. G11C 5/14; H03K 19/00384
USPC ................................................... 365/189.011
See application file for complete search history.

(56) References Cited

U.S. PATENT DOCUMENTS

| | | | | |
|---|---|---|---|---|
| 6,829,177 B2* | 12/2004 | Bedarida | ............... | G11C 7/1051 |
| | | | | 365/189.05 |
| 7,170,324 B2* | 1/2007 | Huber | ................... | H03K 17/163 |
| | | | | 326/82 |
| 7,936,181 B2 | 5/2011 | Blodgett et al. | | |
| 2008/0143406 A1 | 6/2008 | Im et al. | | |
| 2013/0242664 A1* | 9/2013 | Shimizu | ............ | H03K 19/00361 |
| | | | | 365/185.18 |

FOREIGN PATENT DOCUMENTS

| | | |
|---|---|---|
| CN | 101854167 | 10/2010 |
| JP | H05191241 | 7/1993 |
| JP | 2000013213 | 1/2000 |
| JP | 2002335151 | 11/2002 |
| JP | 2003179480 | 6/2003 |
| JP | 2012119883 | 6/2012 |
| KR | 20040009678 | 1/2004 |
| KR | 20090000511 | 1/2009 |
| TW | I351814 | 11/2011 |

OTHER PUBLICATIONS

"Office Action of Taiwan Counterpart Application," dated Apr. 12, 2019, p. 1-p. 5.
"Office Action of Japan Counterpart Application", dated Jul. 2, 2019, pp. 1-7.
"Office Action of Korea Counterpart Application" with English translation thereof, dated Jan. 13, 2020, p. 1-p. 6.
"Office Action of Korea Counterpart Application" with English translation thereof, dated Jun. 10, 2020, p. 1-p. 5.

* cited by examiner

*Primary Examiner* — Anthan Tran
(74) *Attorney, Agent, or Firm* — JCIPRNET

(57) ABSTRACT

An off-chip driver including a first driving circuit is provided. The first driving circuit is used to adjust a slew rate of the off-chip driver. The first driving circuit includes a first pre-driver, a switch string, and a first output stage. The first pre-driver receives a read signal and a first pre-driver control signal. The switch string is configured to perform a voltage division operation in cooperation with the first pre-driver on a power supply voltage according to the read signal, so as to generate a first output stage control signal. The first output stage generates a data signal according to the first output stage control signal.

11 Claims, 5 Drawing Sheets

OFF-CHIP DRIVER

BACKGROUND OF THE INVENTION

1. Field of the Invention

The invention relates to an off-chip driver, and more particularly, to an off-chip driver with adjustable slew rate.

2. Description of Related Art

The off-chip driver is applied in the dynamic random access memory (DRAM) and used to transmit data on a memory to a host. Here, the slew rate and the driving strength of the off-chip driver are defined by the joint electron devices engineering council (JEDEC). These parameters are affected by manufacturing process, voltage and temperature.

In general, the slew rate of the off-chip driver is adjusted by controlling a gate signal of an output stage in the off-chip driver. Nonetheless, the process variation would cause drift in the actual output of the off-chip driver. Another approach is to control an enable timing of the off-chip driver. This approach requires additional design on an enable timing adjustment circuit but still have difficulties in adjusting a timing of the enable timing adjustment circuit considering the process variation.

Furthermore, based on the importance of a current variability dI/dt to a signal integrity (SI), merely keeping the JEDEC specification is insufficient for a high speed input/output circuit (I/O circuit). Therefore, it is still required to design a precise slew rate adjustment circuit for the high speed I/O circuit.

SUMMARY OF THE INVENTION

The invention is directed to an off-chip driver, which is capable of adjusting the slew rate by using the slew rate adjusting circuit without increasing power consumption and layout area.

The invention provides an off-chip driver adapted to a memory, and including a first driving circuit. The first driving circuit is used to adjust a slew rate of the off-chip driver. The first driving circuit includes a first pre-driver, a switch string, and a first output stage. The first pre-driver receives a read signal and a first pre-driver control signal. The switch string is coupled to the first pre-driver. The switch string is configured to perform a voltage division operation in cooperation with the first pre-driver on a power supply voltage according to the read signal, so as to generate a first output stage control signal. The first output stage is coupled to the first pre-driver and the switch string, and the first output stage generates the data signal according to the first output stage control signal.

Based on the above, in the invention, the off-chip driver can adjust the slew rate by using the voltage division operation of the first pre-driver and the switch string without increasing power consumption and layer area. With the symmetrical circuit structures, a control of the slew rate can be maintained under the process variation.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
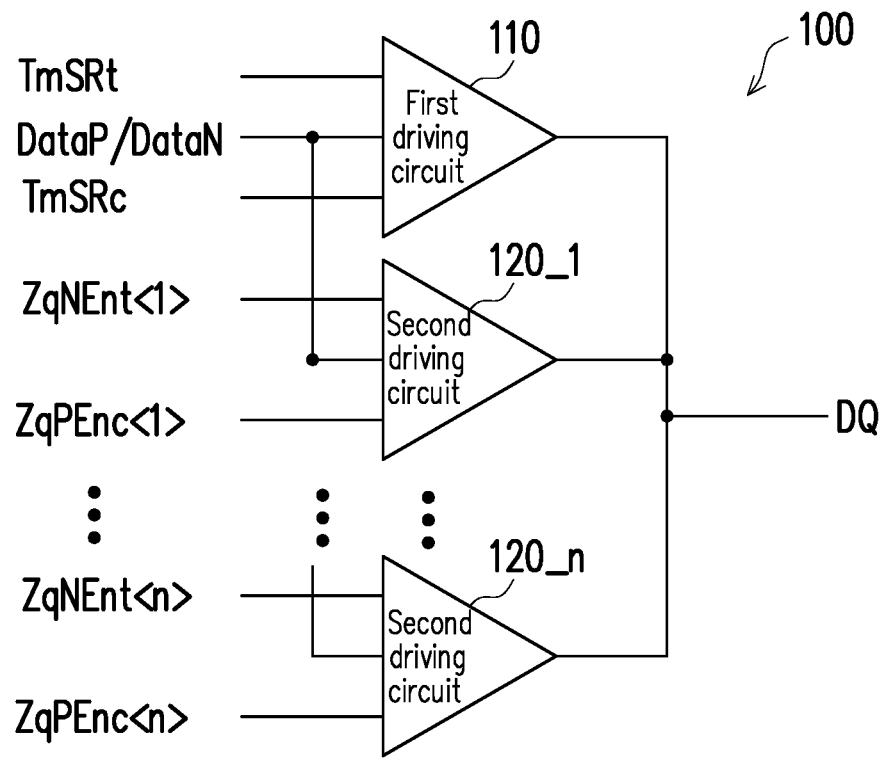
FIG. 1 is a schematic diagram illustrating the off-chip driver in an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

With reference to FIG. 1, an off-chip driver 100 includes a first driving circuit 110 and a plurality of second driving circuits 121_1 to 120_n. The first driving circuit 110 is configured to adjust a slew rate of the off-chip driver 100, and the second driving circuits 120_1 to 120_n are configured to adjust a driving strength of the off-chip driver 100.

In this embodiment, the second driving circuits 120_1 to 120_n are connected in parallel to each other, and the second driving circuits 120_1 to 120_n and the first driving circuit 110 are connected in parallel to each other.

The first driving circuit 110 receives a read signal DataP/DataN, a first pre-driver control signal TmSRt and a first pre-driver control signal TmSRc, so as to generate a data signal DQ. The second driving circuit 120_1 receives the read signal DataP/DataN, a second pre-driver control signal ZqNEnt<1> and a second pre-driver control signal ZqNEnc<1>, so as to generate the data signal DQ. The second driving circuit 120_n receives the read signal DataP/DataN, a second pre-driver control signal ZqNEnt<n> and a second pre-driver control signal ZqNEnc<n>, so as to generate the data signal DQ. The second driving circuits 120_2 to 120_n-1 (not illustrated) can be deduced by analogy based on the above description, which is not repeated hereinafter. The number n of the second driving circuits may be set according to actual requirements without particular limitations.

Figure 2:
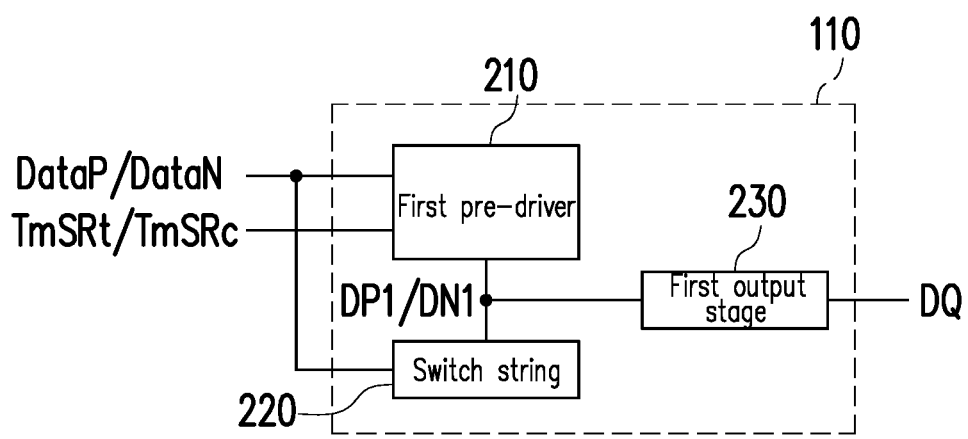
FIG. 2 is a block diagram illustrating the first driving circuit in an embodiment of the invention.
Figure 3:
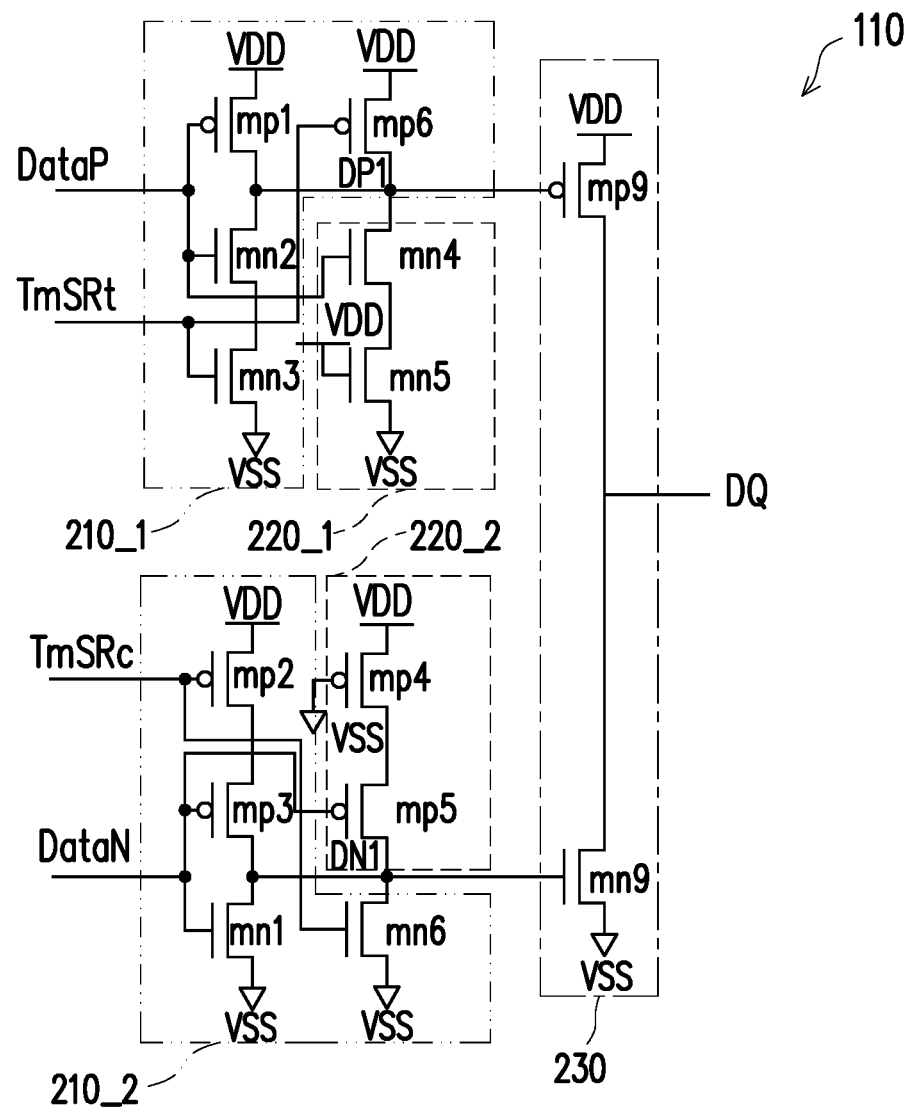
FIG. 3 is a schematic diagram illustrating the first driving circuit in an embodiment of the invention.

Referring to FIG. 2 and FIG. 3 together, in this exemplary embodiment, the first driving circuit 110 includes a first pre-driver 210, a switch string 220 and a first output stage 230. The first pre-driver 210 receives the read signal DataP/DataN and the first pre-driver control signal TmSRt/TmSRc. The switch string 220 is coupled to the first pre-driver 210, and configured to perform a voltage division operation in cooperation with the first pre-driver 210 on a power supply voltage VDD according to the read signal DataP/DataN, so as to generate a first output stage control signal DP1/DN1. The first output stage 230 is coupled to the first pre-driver 210 and the switch string 220, and the first output stage 230 generates the data signal DQ according to the first output stage control signal DP1/DN1.

Referring to FIG. 2 and FIG. 3 together, FIG. 2 may represent the first output stage 230 in FIG. 3 as well as a first pre-driver 210_1 and a switch string 220_1 coupled thereto, and may also represent the first output stage 230 as well as a first pre-driver 210_2 and a switch string 220_2 coupled thereto. In an embodiment, the first output stage 230 generates the data signal DQ according to the first output stage control signal DPI and the first output stage control signal DN1.

With reference to FIG. 3, the first driving circuit 110 includes the first pre-driver 210_1, the first pre-driver 210_2, the switch string 220_1, the switch string 220_2 and the first output stage 230. Among them, the first pre-driver 210_1 and the switch string 220_1 are coupled to a transistor mp9 of the first output stage 230, and the first pre-driver 210_2 and the switch string 220_2 are coupled to a transistor mn9 of the first output stage 230.

The first pre-driver 210_1 includes an inverter, a first switch and a second switch.

The inverter of the first pre-driver 210_1 is composed of a transistor mp1 and a transistor mn2 coupled to each other. A gate of the transistor mp1 and a gate of the transistor mn2 are coupled to each other, and configured to receive read signal DataP. A source of the transistor mp1 is coupled to the power supply voltage VDD, and a drain of the transistor mp1 and a drain of the transistor mn2 are coupled to each other.

The first switch of the first pre-driver 210_1 is a transistor mn3. A drain of the transistor mn3 is coupled to a source of the transistor mn2. A gate of the transistor mn3 receives the first pre-driver control signal TmSRt to thereby turn on or off the transistor mn3. A source of the transistor mn3 is coupled to a power supply voltage VSS.

The second switch of the first pre-driver 210_1 is a transistor mp6. A gate of the transistor mp6 is coupled to the gate of the transistor mn3 to receive the first pre-driver control signal TmSRt to thereby turn on or off the transistor mp6. A source of the transistor mp6 is coupled to the power supply voltage VDD. A drain of the transistor mp6 is coupled to the drain of the transistor mp1 and the drain of the transistor mn2.

The switch string 220_1 includes a third switch and a fourth switch.

The third switch of the switch string 220_1 is a transistor mn4. A drain of the transistor mn4 is coupled to the drain of the transistor mp6, the drain of the transistor mp1 and the drain of the transistor mn2. A gate of the transistor mn4 receives the read signal DataP to thereby turn on or off the transistor mn4.

The fourth switch of the switch string 220_1 is a transistor mn5. A drain of the transistor mn5 is coupled to a source of the transistor mn4 in the switch string 220_1. A gate of the transistor mn5 receives the power supply voltage VDD to thereby turn on the transistor mn5. A source of the transistor mn5 is coupled to the power supply voltage VSS.

In this embodiment, the switch string 220_1 generates the first output stage control signal DP1 in cooperation with the inverter, the first switch and the second switch of the first pre-driver 210_2.

The first pre-driver 210_2 includes an inverter, a first switch and a second switch. Here, the first pre-driver 210_2 is a complementary pattern of the first pre-driver 210_1, and thus description regarding the same is omitted.

The switch string 220_2 includes a third switch (a transistor mp4) and a fourth switch (a transistor mp5). Here, the switch string 220_2 is a complementary pattern of the switch string 220_1, and thus description regarding the same is omitted.

In this embodiment, the switch string 220_2 (the transistor mp4 and the transistor mp5) generates the first output stage control signal DN1 in cooperation with the inverter (transistors mn1 and mp3), the first switch (a transistor mp2) and the second switch (a transistor mn6) of the first pre-driver 210_2.

The first output stage 230 includes the transistor mp9 and the transistor mn9. Here, the transistor mp9 is a P-type transistor, and the transistor mn9 is an N-type transistor. A drain of the transistor mp9 is coupled to a source of the transistor mn9.

In this embodiment, the first output stage 230 receives the first output stage control signal DP1 and the first output stage control signal DN1, and outputs the data signal DQ through the transistors mp9 and mn9 by a push-pull method. Operating method of the first driving circuit 110 when the first pre-driver control signal TmSRt and the first pre-driver control signal TmSRc are at different logic levels would be described in detail in a comparison between FIG. 3 and FIG. 5.

Figure 4:
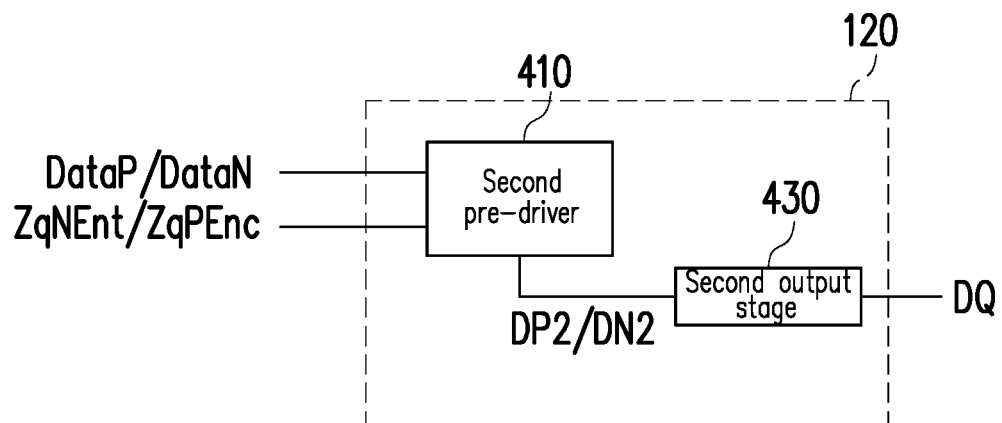
FIG. 4 is a block diagram illustrating the second driving circuit in an embodiment of the invention.

With reference to FIG. 4, the second driving circuit 120 includes a second pre-driver 410 and a second output stage 430.

The second pre-driver 410 receives the read signal DataP/DataN and the second pre-driver control signal ZqNEnt/ZqPEnc so the second pre-driver 410 are turned on or off accordingly. When being turned on, the second pre-driver 410 generates a second output stage signal DP2/DN2.

The second output stage 430 is coupled to the second pre-driver 410, and the second output stage 430 generates the data signal DQ according to the second output stage control signal DP2/DN2.

Figure 5:
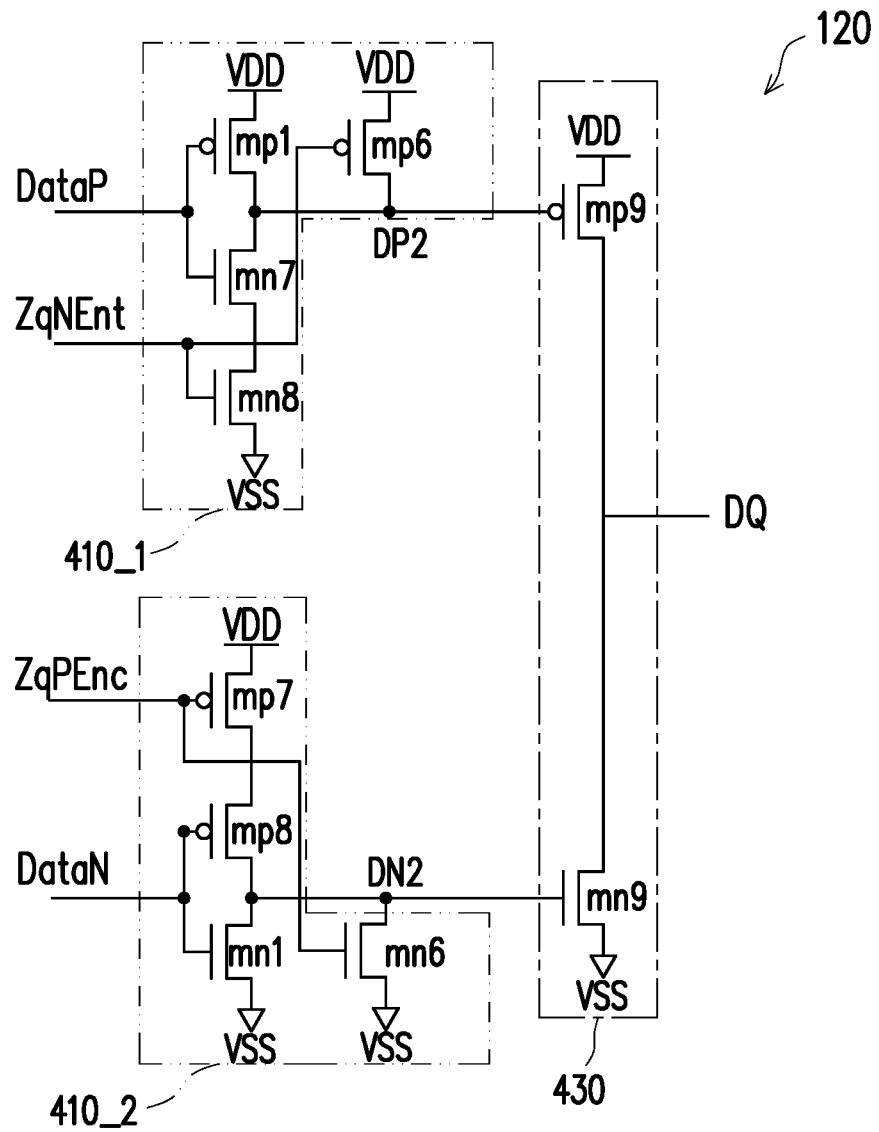
FIG. 5 is a schematic diagram illustrating the second driving circuit in an embodiment of the invention.

Referring to FIG. 4 and FIG. 5 together, it should be noted that, in this exemplary embodiment, FIG. 4 may represent the second output stage 430 in FIG. 5 and a second pre-driver 410_1 coupled thereto, and may also represent the second output stage 430 and a second pre-driver 410_2 coupled thereto. In an embodiment, the second output stage 430 generates the data signal DQ according to the second output stage control signal DP2 and the second output stage control signal DN2.

With reference to FIG. 5, the second driving circuit 120 includes the second pre-driver 410_1, the second pre-driver 410_2 and the second output stage 430. Among them, the second pre-driver 410_1 is coupled to a transistor mp9 of the second output stage 430, and the second pre-driver 410_2 is coupled to a transistor mn9 of the second output stage 430.

The second pre-driver 410_1 includes an inverter, a first switch and a second switch (a transistor mph) of the second pre-driver 410_1.

The inverter of the second pre-driver 410_1 is composed of a transistor mp1 and a transistor mn7 coupled to each other. A gate of the transistor mp1 and a gate of the transistor mn7 are coupled to each other, and configured to receive the read signal DataP. A source of the transistor mp1 is coupled to the power supply voltage VDD, and a drain of the transistor mp1 and a drain of the transistor mn7 are coupled to each other.

The first switch of the second pre-driver 410_1 is a transistor mn8. A drain of the transistor mn8 is coupled to a source of the transistor mn7. A gate of the transistor mn8 receives the second pre-driver control signal ZqNEnt to thereby turn on or off the transistor mn8. A source of the transistor mn8 is coupled to the power supply voltage VSS.

The second switch of the second pre-driver 410_1 is the transistor mp6. A gate of the transistor mp6 is coupled to the gate of the transistor mn8, and configured to receive the second pre-driver control signal ZqNEnt to thereby turn on or off the transistor mp6. A source of the transistor mp6 is coupled to the power supply voltage VDD. A drain of the transistor mp6 is coupled to the drain of the transistor mp1 and the drain of the transistor mn7.

In this exemplary embodiment, when being turned on by the read signal DataP/DataN and the second pre-driver control signal ZqNEnt, the second pre-driver 410_1 generates the second output stage control signal DP2.

The second pre-driver 410_2 includes an inverter (a transistor mp8 and a transistor mn1), a first switch (a transistor mp7) and a second switch (a transistor mn6). Here, the second pre-driver 410_2 is a complementary pattern of the second pre-driver 410_1, and thus description regarding the same is omitted.

In this exemplary embodiment, the second pre-driver 410_2 generates the second output stage control signal DN2 in cooperation with the inverter (the transistors mp8 and mn1), the first switch (the transistor mp7) and the second switch (the transistor mn6).

The second output stage 430 includes the transistor mp9 and the transistor mn9. Here, the transistor mp9 is a P-type transistor, and the transistor mn9 is an N-type transistor. A drain of the transistor mp9 is coupled to a source of the transistor mn9.

In this exemplary embodiment, the second output stage 430 receives the second output stage control signal DP2 and the second output stage control signal DN2, and outputs the data signal DQ through the transistors mp9 and mn9 by the push-pull method.

With reference to FIG. 5, in this exemplary embodiment, when the second pre-driver control signal ZqNEnt is at high logic level and the second pre-driver control signal ZqPEnc is at low logic level, the transistor mn8 is turned on (while the transistor mp6 is turned off), and the transistor mp7 is turned on (while the transistor mn6 is turned off). At the time, the second pre-driver 410_1 and the second pre-driver 410_2 are turned on. In this case, the second pre-driver 410_1 is equivalent to the inverter composed of the transistor mp1 and the transistor mn7, and the second pre-driver 410_2 is equivalent to the inverter composed of the transistor mp8 and the transistor mn1. With the second output stage control signal DP2 generated by the second pre-driver 410_1 and the second output stage control signal DN2 generated by the second pre-driver 410_2, the second output stage 430 can output the data signal DQ by the push-pull method. At the time, the second driving circuit 120 is in an enabled state and able to provide the driving strength to the off-chip driver 100.

Conversely, when the second pre-driver control signal ZqNEnt is at low logic level and the second pre-driver control signal ZqPEnc is at high logic level, the transistor mn8 is turned off (while the transistor mp6 is turned on), and the transistor mp7 is turned off (while the transistor mn6 is turned on). At the time, the inverter (the transistor mp1 and the transistor mn7) becomes open circuit due to the transistor mn8 being turned off, and the second output stage control signal DP2 is at high logical level due to the transistor mp6 being turned on. The inverter (the transistor mp8 and the transistor mn1) becomes open circuit due to the transistor mp7 being turned off, and the second output stage control signal DN2 is at low logical level due to the transistor mn6 being turned on. Because the second output stage control signal DP2 at high logic level and the second output stage control signal DP2 at low logic level would cause both the transistor mp9 and the transistor mn9 to be in a turned-off state, the second output stage 430 is unable to output the data signal DQ. At the time, the second driving circuit 120 is in a disabled state and unable to provide the driving strength the off-chip driver 100.

Referring to FIG. 1 and FIG. 5 together, if the number of the second driving circuits 120_1 to 120_n being turned on is greater, the driving strength provided by the off-chip driver 100 would be higher. Conversely, if the number of the second driving circuits 120_1 to 120_n being turned on is less, the driving strength provided by the off-chip driver 100 would be lower.

With reference to FIG. 3, in an embodiment, the first driving circuit 110 can be in a driving strength adjusting mode or a slew rate adjusting mode according to the first pre-driver control signal TmSRt and the first pre-driver control signal TmSRc.

With reference to FIG. 3, in this exemplary embodiment, when the first pre-driver control signal TmSRt is at high logic level and the first pre-driver control signal TmSRc is at low logic level, the first driving circuit 110 is in the driving strength adjusting mode. At the time, in the first pre-driver 210_1, the transistor mn3 is turned on (while the transistor mp6 is turned off), and the transistor mp2 is turned on (while the transistor mn6 is turned off). In an embodiment, a total of width sizes of the transistor mn2 and the transistor mn4 in the first driving circuit 110 may be equal to a width size of the transistor mn7 in the second driving circuit 120, and a total of width sizes of the transistor mn3 and the transistor mn5 may be equal to a width size of the transistor mn8. In addition, the operation of the first pre-driver 210_2 is similar to that of the first pre-driver 210_1. Also, configuration regarding width sizes of the first pre-driver 210_2 and the switch string 220_2 in the first driving circuit 110 is the same as the above, and is thus not repeated hereinafter. Therefore, the first driving circuit 110 in the driving strength adjusting mode has the same equivalent circuit as the second driving circuit 120. Accordingly, the first driving circuit 110 in the driving strength adjusting mode also has the same timing as the second driving circuit 120, and can be used to adjust the driving strength of the off-chip driver 100.

Conversely, when the first pre-driver control signal TmSRt is at low logic level and the first pre-driver control signal TmSRc is at high logic level, the first driving circuit 110 is in the slew rate adjusting mode. At the time, in the first pre-driver 210_1, the transistor mn3 is turned off (while the transistor mp6 is turned on), and the transistor mp2 is turned off (while the transistor mn6 is turned on). In an embodiment, the total of the width sizes of the transistor mn2 and the transistor mn4 may be equal to the width size of the transistor mn7, and the total of the width sizes of the transistor mn3 and the transistor mn5 may be equal to the width size of the transistor mn8. At the time, the first pre-driver 210_1 and the switch string 220_1 are equivalent to a voltage division structure composed of the transistor mn6, the transistor mn4 and the transistor mn5, and the voltage division structure performs a voltage division operation on the power supply voltage VDD. Because the width size of the transistor mn4 is smaller than the transistor mn7 and the width size of the transistor mn5 is smaller than the transistor mn8, on-resistances of the transistor mn4 and the transistor mn5 are greater than on-resistances of the transistor mn7 and the transistor mn8, which cause the voltage of the first output stage control signal DP1 to increase. Operations of the first pre-driver 210_2 and the switch string 220_2 are similar to those of the first pre-driver 210_1 and the switch string 220_1 described above, which are not repeated hereinafter. Because the width size of the transistor mp4 is smaller the transistor mp7 and the width size of the transistor mp5 is smaller than the transistor mp8, on-resistances of the transistor mp4 and the transistor mp5 are greater than on-resistances of the transistor mp7 and the transistor mp8, which cause the voltage of the first output stage control signal DN1 to decrease.

Accordingly, the increased voltage of the first output stage control signal DP1 and the decreased voltage of the first output stage control signal DN1 would decrease on-current of the first output stage 230, so as to reduce the slew rate and increase a transition time. Therefore, the first driving circuit 110 in the slew rate adjusting mode may be used to adjust the slew rate of the off-chip driver 100.

It is worth noting that, regardless of whether the first driving circuit 110 is in the driving strength adjusting mode or the slew rate adjusting mode, the first driving circuit is constantly enabled.

Figure 6:
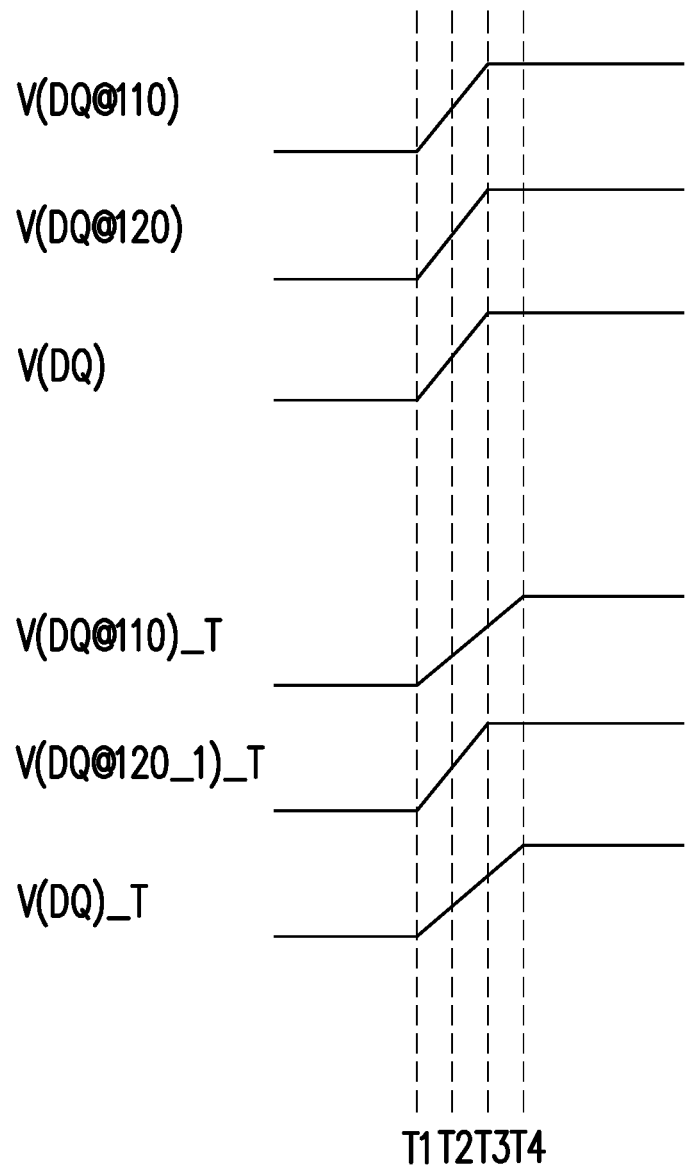
FIG. 6 illustrates a timing diagram of the off-chip driver in an embodiment of the invention.

With reference to FIG. 6, in an embodiment, the off-chip driver 100 includes a non-test mode and a test mode. In the non-test mode, the first driving circuit 110 is in the driving strength adjusting mode. In the test mode, the first driving circuit 110 is in the slew rate adjusting mode. Timing of the non-testing mode includes a data signal V(DQ@110) output by the first driving circuit in the non-test mode, a data signal V(DQ@120) output by the second driving circuit in the non-test mode and a data signal V(DQ) of the off-chip driver in the non-test mode. Timing of the testing mode includes a data signal V(DQ@110)_T output by the first driving circuit in the test mode, a data signal V(DQ@120_1)_T output by the second driving circuit in the non-test mode and a data signal V(DQ)_T of the off-chip driver in the non-test mode. Here, the data signal V(DQ@120) output by the second driving circuit in the non-test mode is the data signal DQ output by the other driving circuits excluding the first driving circuit 110 in the non-test mode. The data signal V(DQ@120_1)_T output by the second driving circuit in the test mode is the data signal DQ output by the second driving circuit 120_1 in the test mode.

In the non-test mode, the first driving circuit 110 is in the driving strength adjusting mode, and the transition time is a period between a time T1 and a time T3. In the test mode, since the first driving circuit 110 is in the slew rate adjusting mode, the transition time of the data signal V(DQ@110) T output by the first driving circuit in the test mode and the data signal V(DQ)_T output by the off-chip driver in the test mode is longer and is a period between the time T1 and a time T4. Therefore, the first driving circuit 110 in the slew rate mode would reduce the slew rate of the first driving circuit 110 and the off-chip driver 100.

Figure 7:
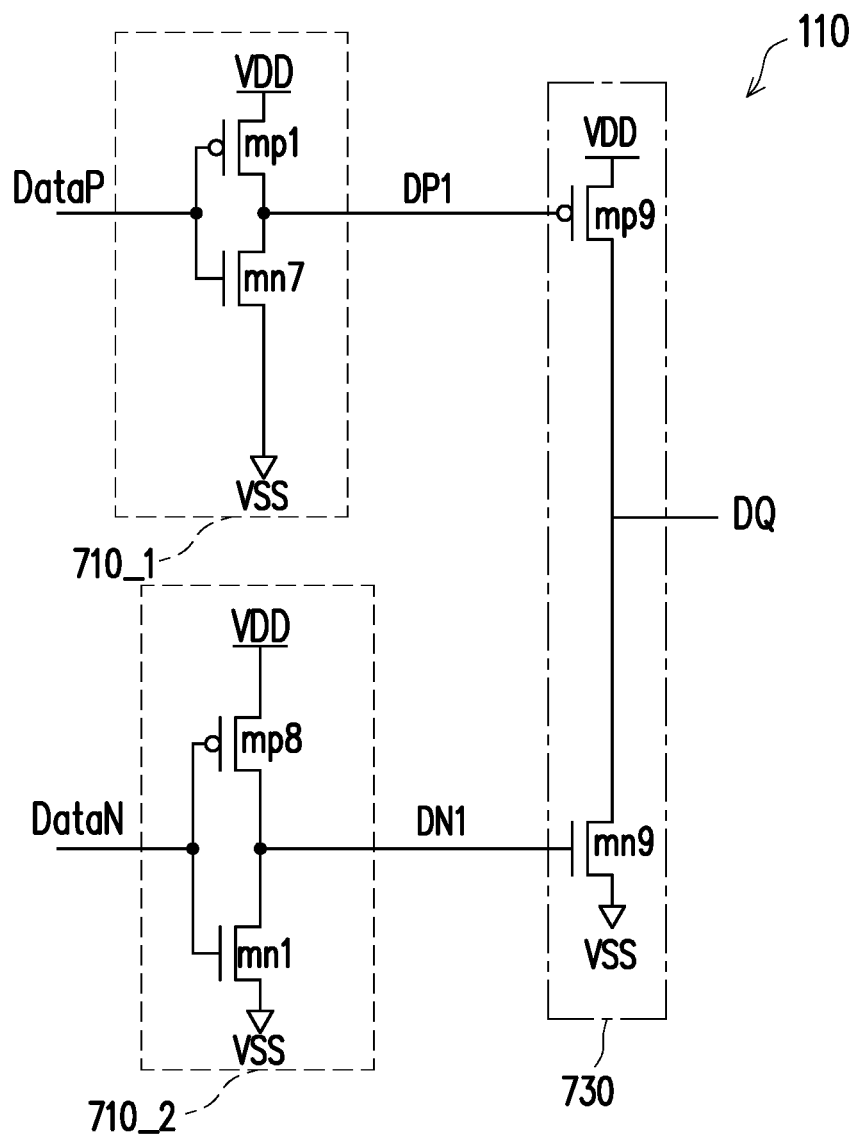
FIG. 7 is a block diagram illustrating the first driving circuit in another embodiment of the invention.

With reference to FIG. 7, in another embodiment, in order to reduce the number of transistors and layout area, the first driving circuit 110 may also be configured to not include the slew rate adjusting mode. In another embodiment, the first driving circuit 110 includes only a first pre-driver 710_1, a first pre-driver 710_2 and a first output stage 730. Also, the first pre-driver 710_1 in the first driving circuit 110 includes only an inverter (composed of a transistor mp1 and a transistor mn7) without having a first switch and a second switch. The first pre-driver 710_2 in the first driving circuit 110 has the same configuration as the above, which is not repeated hereinafter.

To sum up, in the invention, the off-chip driver includes the first driving circuit for adjusting the slew rate, which is used to improve the signal integrity. Because the first driving circuit that adopts the voltage division structure does not need additional delay circuits, power consumption and layout area may be saved accordingly. Since the invention has a symmetrical slew rate adjustment effect in a high threshold voltage process and a low threshold voltage process, the control of the slew rate can be maintained under the process variation. Furthermore, the invention may further include the second driving circuit to adjust the driving strength of the off-chip driver.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An off-chip driver adapted to a memory, and comprising:
    a first driving circuit, configured to adjust a slew rate of the off-chip driver, and comprising:
        a first pre-driver, receiving a read signal and a first pre-driver control signal;
        a switch string, coupled to the first pre-driver, and configured to receive the read signal and perform a voltage division operation in cooperation with the first pre-driver on a power supply voltage according to the read signal, so as to generate a first output stage control signal; and
        a first output stage, coupled to the first pre-driver and the switch string, and generating a data signal according to the first output stage control signal,
    wherein the first pre-driver comprises:
        an inverter, comprising an input terminal receiving the read signal, a first power terminal electrically connected to the power supply voltage, a second power terminal, and an output terminal;
        a first switch, electrically connected to the second power terminal of the inverter, and comprising a control terminal receiving the first pre-driver control signal; and
        a second switch, electrically connected to the output terminal of the inverter and the control terminal of the first switch, and comprising a control terminal receiving the first pre-driver control signal,
    wherein the first driving circuit determines whether to adjust the slew rate of the off-chip driver according to the first pre-driver control signal.

2. The off-chip driver according to claim 1, wherein the switch string comprises:
    a third switch, coupled to the first pre-driver, and being turned on or off according to the read signal; and
    a fourth switch, coupled to the third switch, and being turned on according to the power supply voltage.

3. The off-chip driver according to claim 1, wherein the first driving circuit is in a driving strength adjusting mode or the slew rate adjusting mode according to the first pre-driver control signal.

4. The off-chip driver according to claim 1, wherein the first output stage comprises a P-type transistor and an N-type transistor, wherein a drain of the P-type transistor is coupled to a drain of the N-type transistor.

5. The off-chip driver according to claim 1, wherein the first driving circuit is constantly enabled.

6. The off-chip driver according to claim 5, further comprising:
    a plurality of second driving circuits, connected in parallel to each other and configured to adjust a driving strength of the off-chip driver, each of the second driving circuits comprising:

a second pre-driver, receiving the read signal and a second pre-driver control signal to be turned on or off, the second pre-driver generating a second output stage control class control signal when being turned on; and a second output stage, coupled to the second pre-driver, and generating the data signal according to the second output stage control signal.

7. The off-chip driver according to claim 6, wherein the second pre-driver comprises:

an inverter, receiving the read signal;

a first switch, coupled to the inverter, the first switch being turned on or off according to the second pre-driver control signal; and a second switch, coupled to the inverter and the first switch, the second switch being turned on or off according to the second pre-driver control signal.

8. The off-chip driver according to claim 6, wherein the second driving circuits and the first driving circuit are connected in parallel to each other.

9. The off-chip driver according to claim 6, wherein the second output stage comprises a P-type transistor and an N-type transistor, wherein a drain of the P-type transistor is coupled to a drain of the N-type transistor.

10. The off-chip driver according to claim 6, wherein when one of the second driving circuits is enabled by the second pre-driver control signal and the first pre-driver control signal and the second pre-driver control signal have the same logical level, the second driving circuit has the same timing as the first driving circuit.

11. The off-chip driver according to claim 1, wherein when the first pre-driver control signal is at high logic level, the first driving circuit is in a driving strength adjusting mode to adjust a driving strength of the off-chip driver; and when the first pre-driver control signal is at low logic level, the first driving circuit is in a slew rate adjusting mode to adjust the slew rate of the off-chip driver.

\* \* \* \* \*